United States Patent
Nowak et al.

(10) Patent No.: US 10,932,399 B1
(45) Date of Patent: Feb. 23, 2021

(54) ELECTROMAGNETIC SHIELDING MATERIAL AND METHODS OF FORMATION

(71) Applicant: The Boeing Company, Chicago, IL (US)

(72) Inventors: Andrew P. Nowak, Los Angeles, CA (US); Adam F. Gross, Santa Monica, CA (US); April R. Rodriguez, Santa Monica, CA (US); Russell Mott, Chicago, IL (US); Richard E. Sharp, Weldon Spring, MO (US); Ashley Dustin, Los Angeles, CA (US)

(73) Assignee: THE BOEING COMPANY, Chicago, IL (US)

( * ) Notice: Subject to any disclaimer, the term of this patent is extended or adjusted under 35 U.S.C. 154(b) by 0 days.

(21) Appl. No.: 16/722,233

(22) Filed: Dec. 20, 2019

(51) Int. Cl.
*H05K 9/00* (2006.01)
*B29C 70/88* (2006.01)
*B22F 1/02* (2006.01)

(52) U.S. Cl.
CPC .......... *H05K 9/0083* (2013.01); *B22F 1/025* (2013.01); *B29C 70/882* (2013.01); *H05K 9/0015* (2013.01)

(58) Field of Classification Search
CPC .............. B29K 2995/0011; B29K 2995/0008
See application file for complete search history.

(56) References Cited

U.S. PATENT DOCUMENTS

| 4,271,782 A | * | 6/1981 | Bate | ............... G11B 5/845 118/623 |
|---|---|---|---|---|
| 2009/0197063 A1 | * | 8/2009 | Uchikiba | ............... H01F 1/26 428/220 |
| 2016/0194459 A1 | * | 7/2016 | Kozar | ............... C08J 5/04 523/201 |
| 2019/0232582 A1 | | 8/2019 | Nowak et al. | |
| 2019/0292336 A1 | * | 9/2019 | Humfeld | ............ C08G 65/4012 |

* cited by examiner

*Primary Examiner* — Hung V Ngo
(74) *Attorney, Agent, or Firm* — McDonnell, Boehnen Hulbert & Berghoff LLP (57) ABSTRACT

Examples include a method of forming an electromagnetic shielding material, the method including: applying a magnetic field to a precursor material that includes first ferromagnetic particles embedded within a first portion of a matrix material and second ferromagnetic particles embedded within a second portion of the matrix material, thereby causing the first ferromagnetic particles and the second ferromagnetic particles to move such that longitudinal axes of the first ferromagnetic particles and the second ferromagnetic particles become more aligned with the magnetic field; thereafter forcing the first portion of the matrix material through a filter, thereby moving the first ferromagnetic particles from the first portion of the matrix material into the second portion of the matrix material; and curing the second portion of the matrix material to form the electromagnetic shielding material. Additional examples include an electromagnetic shielding material and an apparatus for forming an electromagnetic shielding material.

20 Claims, 12 Drawing Sheets

APPLYING A MAGNETIC FIELD TO A PRECURSOR MATERIAL THAT COMPRISES FIRST FERROMAGNETIC PARTICLES EMBEDDED WITHIN A FIRST PORTION OF A MATRIX MATERIAL AND SECOND FERROMAGNETIC PARTICLES EMBEDDED WITHIN A SECOND PORTION OF THE MATRIX MATERIAL, THEREBY CAUSING THE FIRST FERROMAGNETIC PARTICLES AND THE SECOND FERROMAGNETIC PARTICLES TO MOVE SUCH THAT LONGITUDINAL AXES OF THE FIRST FERROMAGNETIC PARTICLES AND THE SECOND FERROMAGNETIC PARTICLES BECOME MORE ALIGNED WITH THE MAGNETIC FIELD

302

THEREAFTER FORCING THE FIRST PORTION OF THE MATRIX MATERIAL THROUGH A FILTER, THEREBY MOVING THE FIRST FERROMAGNETIC PARTICLES FROM THE FIRST PORTION OF THE MATRIX MATERIAL INTO THE SECOND PORTION OF THE MATRIX MATERIAL

304

CURING THE SECOND PORTION OF THE MATRIX MATERIAL TO FORM AN ELECTROMAGNETIC SHIELDING MATERIAL

```
┌─────────────────────────────────────────────────────────────┐
│                                                             │
│   PLACING THE PRECURSOR MATERIAL INTO A SYRINGE BETWEEN     │
│         A PISTON AND AN END OF THE SYRINGE                  │
│                                                             │
└─────────────────────────────────────────────────────────────┘
     308┘
                                │
                                ▼
┌─────────────────────────────────────────────────────────────┐
│                                                             │
│        ATTACHING THE FILTER TO THE END OF THE SYRINGE       │
│                                                             │
└─────────────────────────────────────────────────────────────┘
     310┘
                                                        ↖ 330

FIG. 13

┌─────────────────────────────────────────────────────────────┐
│                                                             │
│  REMOVING AIR FROM THE SYRINGE PRIOR TO FORCING THE         │
│  FIRST PORTION OF THE MATRIX MATERIAL THROUGH THE FILTER    │
│                                                             │
└─────────────────────────────────────────────────────────────┘
     312┘
                                                        ↖ 340

FIG. 14
```

POSITIONING THE SYRINGE SO THAT A GRAVITATIONAL FORCE ACTS TO MOVE THE PRECURSOR MATERIAL TOWARD THE FILTER

ELECTROMAGNETIC SHIELDING MATERIAL AND METHODS OF FORMATION

FIELD

The present disclosure generally relates to electromagnetic shielding materials, and more specifically to methods for forming electromagnetic shielding materials.

BACKGROUND

Electromagnetic interference (EMI) is an electromagnetic field and/or an electrostatic field generated by an external source that negatively affects an electrical circuit by electromagnetic induction, electrostatic coupling, or conduction. Aerial vehicles and aerospace vehicles may encounter EMI generated by a wide variety of sources. For instance, EMI may be generated by environmental conditions (e.g., lighting, solar flares, and/or an electrostatic discharge) or electrical devices on or near the vehicle (e.g., cell phones, laptop computers, tablet computers, antennas, and/or toys). In some instances, the EMI can negatively affect performance of electrical equipment on the vehicle. For example, on an aircraft, EMI can affect cockpit radios and radar signals, interfering with communication between a pilot and a control tower.

To mitigate the effects of EMI on avionic and aerospace equipment performance, some aerial vehicles and aerospace vehicles include devices that provide EMI shielding to electrical equipment. EMI shielding is the practice of reducing (or preventing) an electromagnetic field in a space by blocking the field with a barrier made of conductive and/or magnetic materials. One approach to EMI shielding is to house the electrical equipment in an enclosure made from dense, continuous sheets of metal or a mesh cage of metal. However, these EMI shielding enclosures tend to be relatively heavy, which reduces the fuel efficiency and flight range of the aerial vehicle or aerospace vehicle. Thus, a need exists for methods of forming lighter electromagnetic shielding materials.

SUMMARY

One aspect of the disclosure is a method of forming an electromagnetic shielding material, the method comprising: applying a magnetic field to a precursor material that comprises first ferromagnetic particles embedded within a first portion of a matrix material and second ferromagnetic particles embedded within a second portion of the matrix material, thereby causing the first ferromagnetic particles and the second ferromagnetic particles to move such that longitudinal axes of the first ferromagnetic particles and the second ferromagnetic particles become more aligned with the magnetic field; thereafter forcing the first portion of the matrix material through a filter, thereby moving the first ferromagnetic particles from the first portion of the matrix material into the second portion of the matrix material; and curing the second portion of the matrix material to form the electromagnetic shielding material.

Another aspect of the disclosure is an electromagnetic shielding material comprising: a matrix material; and ferromagnetic particles embedded within the matrix material and having respective longitudinal axes that are substantially parallel to each other, wherein the ferromagnetic particles are 20 to 70 percent of the electromagnetic shielding material measured by mass.

A further aspect of the disclosure is an apparatus for forming an electromagnetic shielding material, the apparatus comprising: a syringe; a piston; a hollow piston shaft attached to the piston, wherein the piston and the hollow piston shaft are configured to be inserted into the syringe at a first end of the syringe such that the piston makes an airtight seal with the syringe; a first magnet positioned within the hollow piston shaft; a filter; a hub configured to house the filter and to be attached to a second end of the syringe; and a second magnet, wherein the first magnet and the second magnet are configured to apply a magnetic field within the syringe.

By the term "about" or "substantially" with reference to amounts or measurement values described herein, it is meant that the recited characteristic, parameter, or value need not be achieved exactly, but that deviations or variations, including for example, tolerances, measurement error, measurement accuracy limitations and other factors known to those of skill in the art, may occur in amounts that do not preclude the effect the characteristic was intended to provide.

The features, functions, and advantages that have been discussed can be achieved independently in various examples or may be combined in yet other examples further details of which can be seen with reference to the following description and drawings.

BRIEF DESCRIPTION OF THE DRAWINGS

The novel features believed characteristic of the illustrative examples are set forth in the appended claims. The illustrative examples, however, as well as a preferred mode of use, further objectives and descriptions thereof, will best be understood by reference to the following detailed description of an illustrative example of the present disclosure when read in conjunction with the accompanying Figures.

DETAILED DESCRIPTION

As discussed above, there exists a need for methods of forming lighter electromagnetic shielding materials. Within examples, a method of forming an electromagnetic shielding material includes applying a magnetic field to a precursor material that includes first ferromagnetic particles (e.g., shavings comprised of iron, nickel and/or cobalt) embedded within a first portion of a matrix material (e.g., curable viscous resin) and second ferromagnetic particles embedded within a second portion of the matrix material. The applied magnetic field causes the first ferromagnetic particles and the second ferromagnetic particles to move (e.g., rotate) such that longitudinal axes of the first ferromagnetic particles and the second ferromagnetic particles become more aligned with the magnetic field. After alignment, the method includes forcing (e.g., via a piston and a syringe) the first portion of the matrix material through a filter, thereby moving the first ferromagnetic particles from the first portion of the matrix material into the second portion of the matrix material (e.g., concentrating the ferromagnetic particles within the second portion of the matrix material). The method also includes curing (e.g., heating and/or hardening) the second portion of the matrix material to form the electromagnetic shielding material. The magnetic field can be applied via a first magnet positioned behind the piston and/or a second magnet positioned behind the filter.

Accordingly, additional examples include an apparatus for forming the electromagnetic shielding material. The apparatus includes a syringe, a piston, and a hollow piston shaft attached to the piston. The piston and the hollow piston shaft are configured to be inserted into the syringe at a first end of the syringe such that the piston makes an airtight seal with the syringe. The apparatus also includes a first magnet positioned within the hollow piston shaft (e.g., against the piston) and a filter. The apparatus also includes a hub configured to house the filter and to be attached to a second end of the syringe. The apparatus also includes a second magnet, with the first magnet and the second magnet being configured to apply a magnetic field within the syringe.

The aforementioned method and apparatus can be advantageous when compared to previous methods and apparatus because they could be used to form electromagnetic shielding materials that are lighter and/or more effective in blocking or absorbing electromagnetic radiation.

Disclosed examples will now be described more fully hereinafter with reference to the accompanying Drawings, in which some, but not all of the disclosed examples are shown. Indeed, several different examples may be described and should not be construed as limited to the examples set forth herein. Rather, these examples are described so that this disclosure will be thorough and complete and will fully convey the scope of the disclosure to those skilled in the art.

Figure 1:
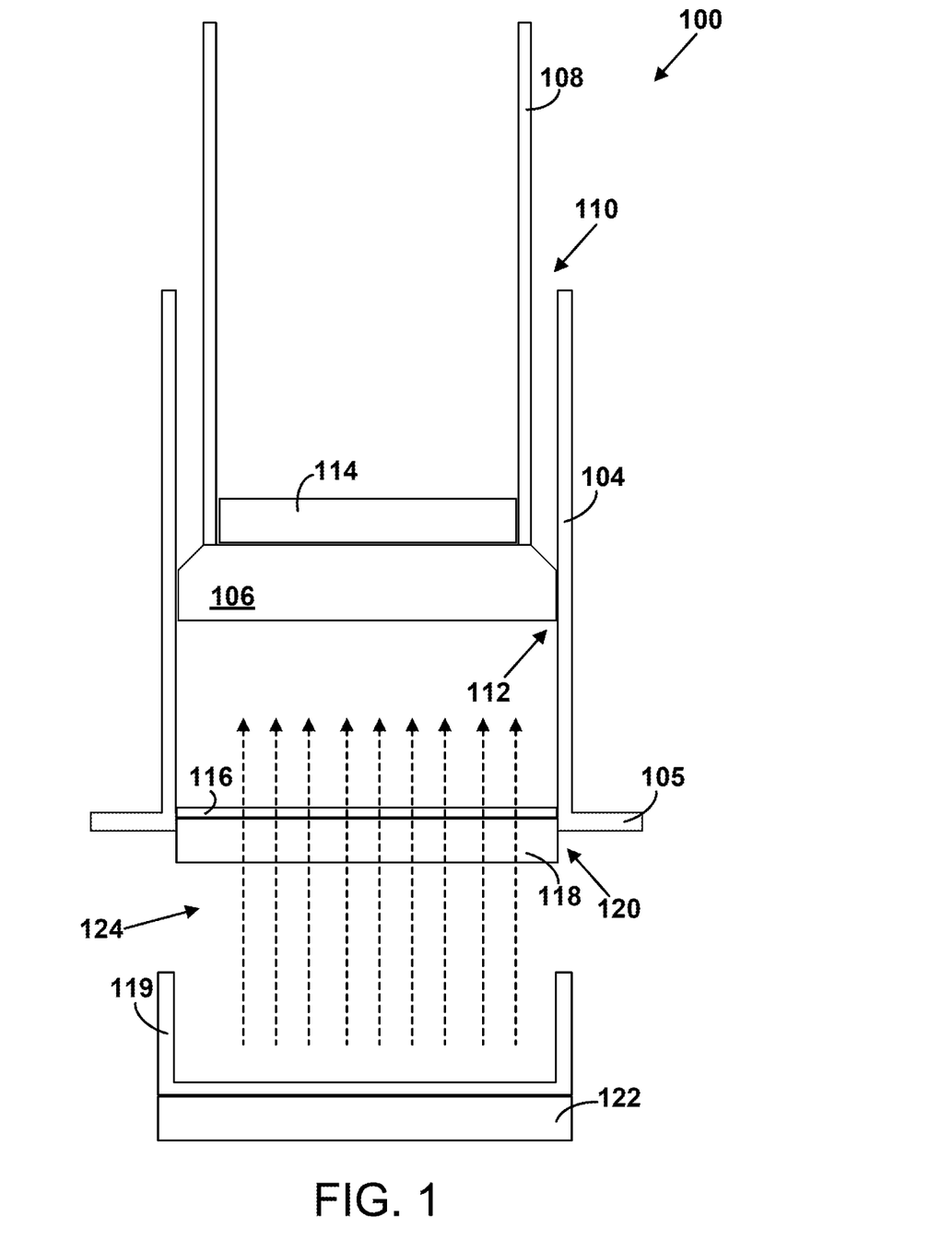
FIG. 1 is a cross sectional view of an apparatus, according to an example.
Figure 2:
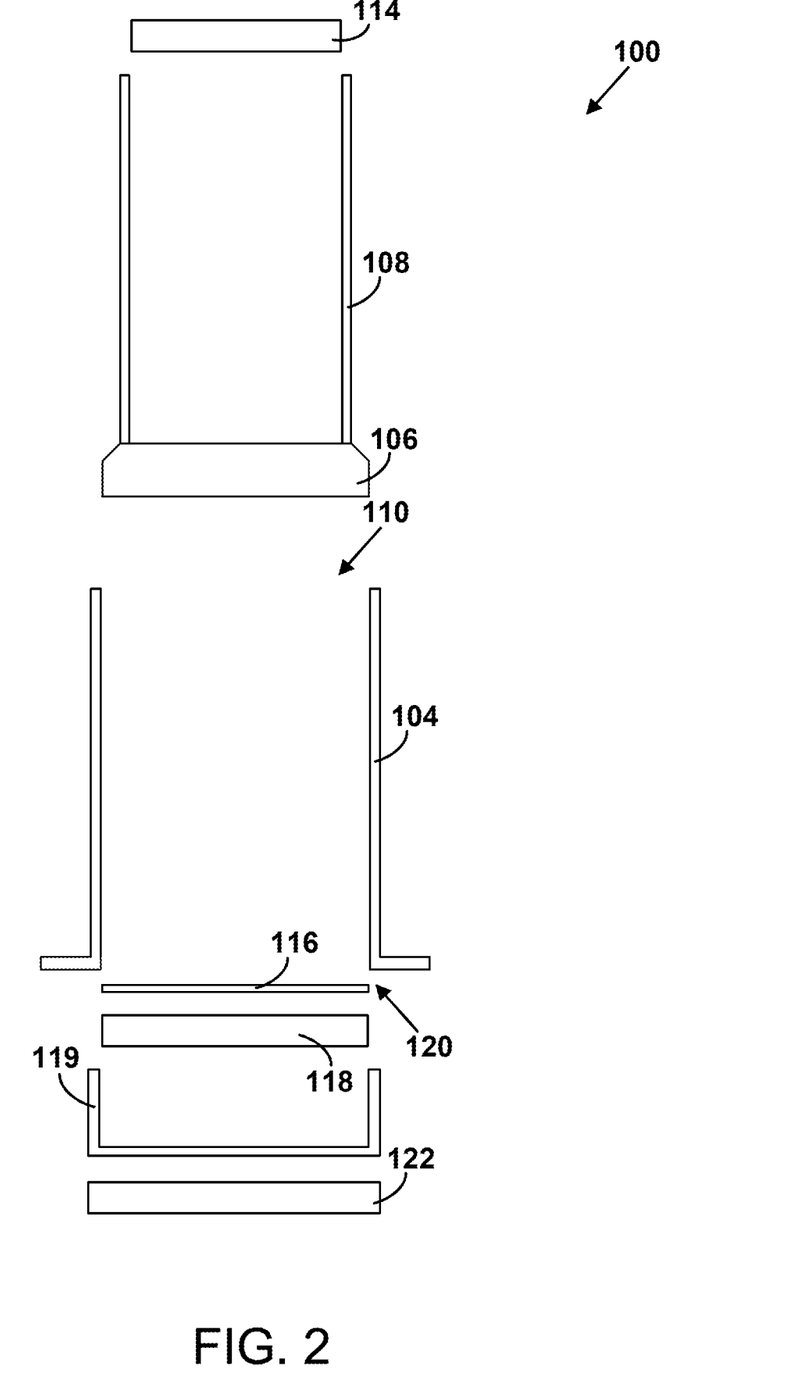
FIG. 2 is a cross sectional exploded view of an apparatus, according to an example.

FIG. 1 and FIG. 2 depict an apparatus 100 for forming an electromagnetic shielding material. The apparatus 100 can be used to form an electromagnetic shielding material 200 shown in FIGS. 3-5. Use of the apparatus 100 is depicted in FIGS. 6-10. The apparatus 100 can be used in conjunction with the methods 300, 330, 340, and 345 shown in FIGS. 12-15.

FIG. 1 is a cross sectional view of the apparatus 100. As shown in FIG. 1, the apparatus 100 includes a syringe 104, a piston 106, and a hollow piston shaft 108 attached to the piston 106. The piston 106 and the hollow piston shaft 108 are configured to be inserted into the syringe 104 at a first end 110 of the syringe 104 such that the piston 106 makes an airtight seal 112 with the syringe 104. The apparatus 100 also includes a first magnet 114 positioned within the hollow piston shaft 108, a filter 116, a hub 118 configured to house the filter 116 and to be attached to a second end 120 of the syringe 104, and a second magnet 122. The first magnet 114 and the second magnet 122 are configured to apply a magnetic field 124 within the syringe 104.

The syringe 104 takes the form of a plastic cylindrical tube, with the first end 110 having a circular form when viewed from above. The second end 120 of the syringe 104 includes an outwardly extending radial flange 105. The syringe can have other shapes and be formed of other materials as well.

The piston 106 takes the form of a rubber gasket having an outer diameter that is substantially equal to an inner diameter of the syringe 104. The piston 106 forms an airtight (e.g., watertight and/or fluid-tight) seal with an inner wall of the syringe 104 such that substantially zero air or other fluids within the syringe 104 are allowed to move past the piston 106 when the piston 106 is positioned within the syringe 104. The piston can have other shapes and be formed of other materials as well.

The hollow piston shaft 108 takes the form of a plastic cylindrical tube that has an outer diameter that is smaller (e.g., 10% smaller) than the inner diameter of the syringe 104. The hollow piston shaft 108 is glued or otherwise adhered or attached to the piston 106. The hollow piston shaft can have other shapes and be formed of other materials as well. The hollow piston shaft 108 serves as a handle that a user can grasp to move the piston 106 back and forth within the syringe 104.

The first magnet 114 and second magnet 122 can each take the respective forms of a neodymium magnet or another type of permanent magnet. The first magnet 114 and second magnet 122 will each generally have a solid cylindrical form, similar to a hockey puck, but other examples are possible. More specifically, the first magnet 114 generally has an outer diameter that is smaller than an inner diameter of the hollow piston shaft 108 so that the first magnet 114 can be placed inside the hollow piston shaft 108. The first magnet and the second magnet can have other shapes and be formed of other materials as well.

The filter 116 includes cellulosic fibers. For example, the filter 116 could take the form of a coffee filter. The filter 116 is configured to allow a matrix material such as curable viscous resin to pass through the filter 116 and to capture ferromagnetic particles such as those described in more detail below. The filter can have other shapes and be formed of other materials as well.

The hub 118 is a plastic cartridge that houses the filter 116 and is configured to be attached to the second end 120 of the syringe 104. For example, the hub 118 could form a threaded attachment with the second end 120 or the hub 118 could form an interference fit with an inner wall of the second end 120. The hub can have other shapes and be formed of other materials as well.

The apparatus 100 also includes a drip cup 119 which is a plastic receptacle or bowl that can be used for collecting matrix material that passes through the filter 116. The drip cup can have other shapes and be formed of other materials as well.

FIG. 2 is a cross sectional exploded view of the apparatus 100.

Figure 3:
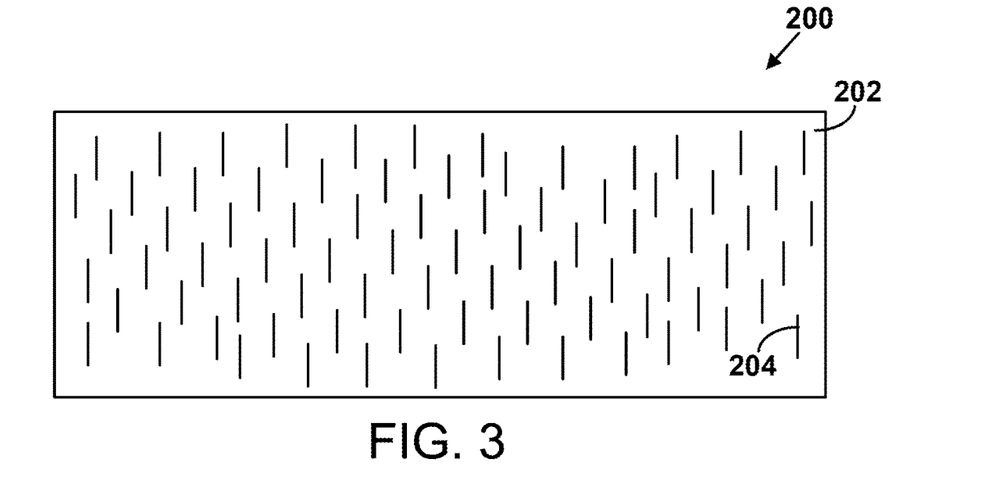
FIG. 3 is a cross sectional view of an electromagnetic shielding material, according to an example.

FIG. 3 shows the electromagnetic shielding material 200. The electromagnetic shielding material 200 includes a matrix material 202 and ferromagnetic particles 204 embedded within the matrix material 202. The ferromagnetic particles 204 have respective longitudinal axes that are substantially parallel to each other.

The matrix material 202 can include any curable viscous resin (e.g., an epoxy resin). In its finished form being incorporated into the electromagnetic shielding material 200, the matrix material 202 is in a cured and hardened form and the ferromagnetic particles 204 are suspended within the matrix material 202. The matrix material 202 is generally an electrical insulator. Other examples are possible.

The ferromagnetic particles 204 include particles or shavings of any ferromagnetic material, such as iron, nickel, or cobalt, or combinations thereof. The ferromagnetic particles 204 can include alloys composed of iron, nickel, and/or cobalt, and/or mixtures of iron, nickel, and/or cobalt. The ferromagnetic particles 204 can include some pure iron particles, some pure nickel particles, and/or some pure cobalt particles, for example. The ferromagnetic particles 204 can also additionally include molybdenum, manganese, tin, copper, titanium, and/or aluminum and any alloys or mixtures composed thereof. The ferromagnetic particles 204 are generally electrically conductive.

The ferromagnetic particles 204 can be 20 to 70 percent (e.g., 35 to 65 percent or 45 to 65 percent) of the electromagnetic shielding material 200 measured by mass.

The ferromagnetic particles 204 can be 5 to 70 percent (e.g., 20 to 50 percent) of the electromagnetic shielding material 200 measured by volume.

Figure 4:
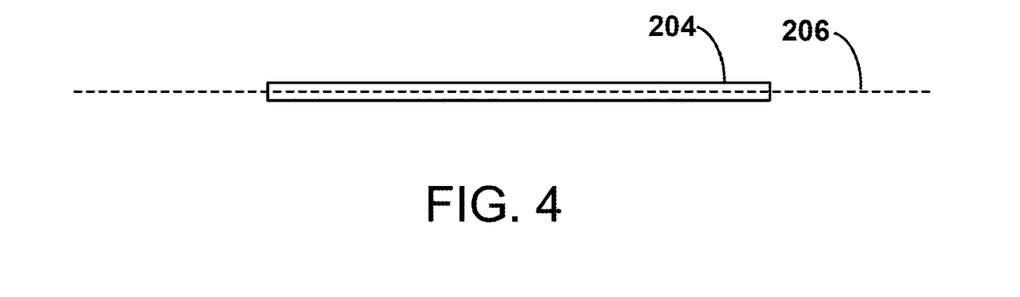
FIG. 4 is a front view of a ferromagnetic particle, according to an example.

FIG. 4 shows a ferromagnetic particle 204 and its corresponding longitudinal axis 206. The ferromagnetic particle 204 takes the approximate form of a cylinder having a length of 200 to 300 μm (e.g., 250 μm) and a diameter of 0.5 to 10 μm.

Figure 5:
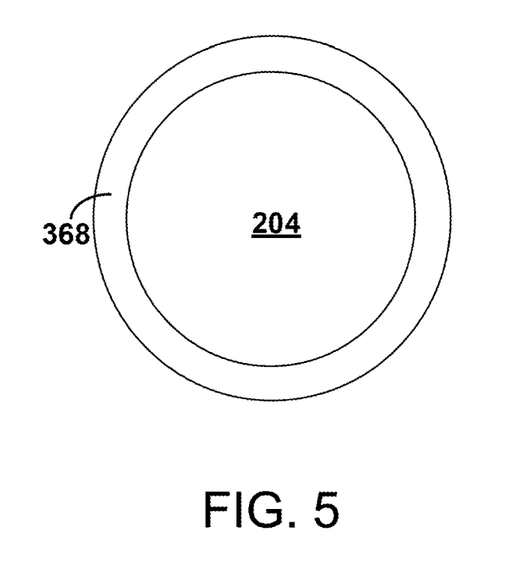
FIG. 5 is a cross sectional view of a ferromagnetic particle, according to an example.

FIG. 5 shows a cross section of a ferromagnetic particle 204. As shown, the ferromagnetic particle 204 can be radially surrounded by an insulating material 368 that is distinct from the matrix material 202. The insulating material 368 can include one or more of cellulosic materials, carboxy methyl cellulose, hydroxy propyl cellulose, polyvinylpyrolidone, polyvinyl acetate, acrylates, polyethylene, or polypropylene.

FIGS. 6-10 show functionality related to the apparatus 100 and to the methods 300, 330, 340, and 345 shown in FIGS. 12-15.

Figure 6:
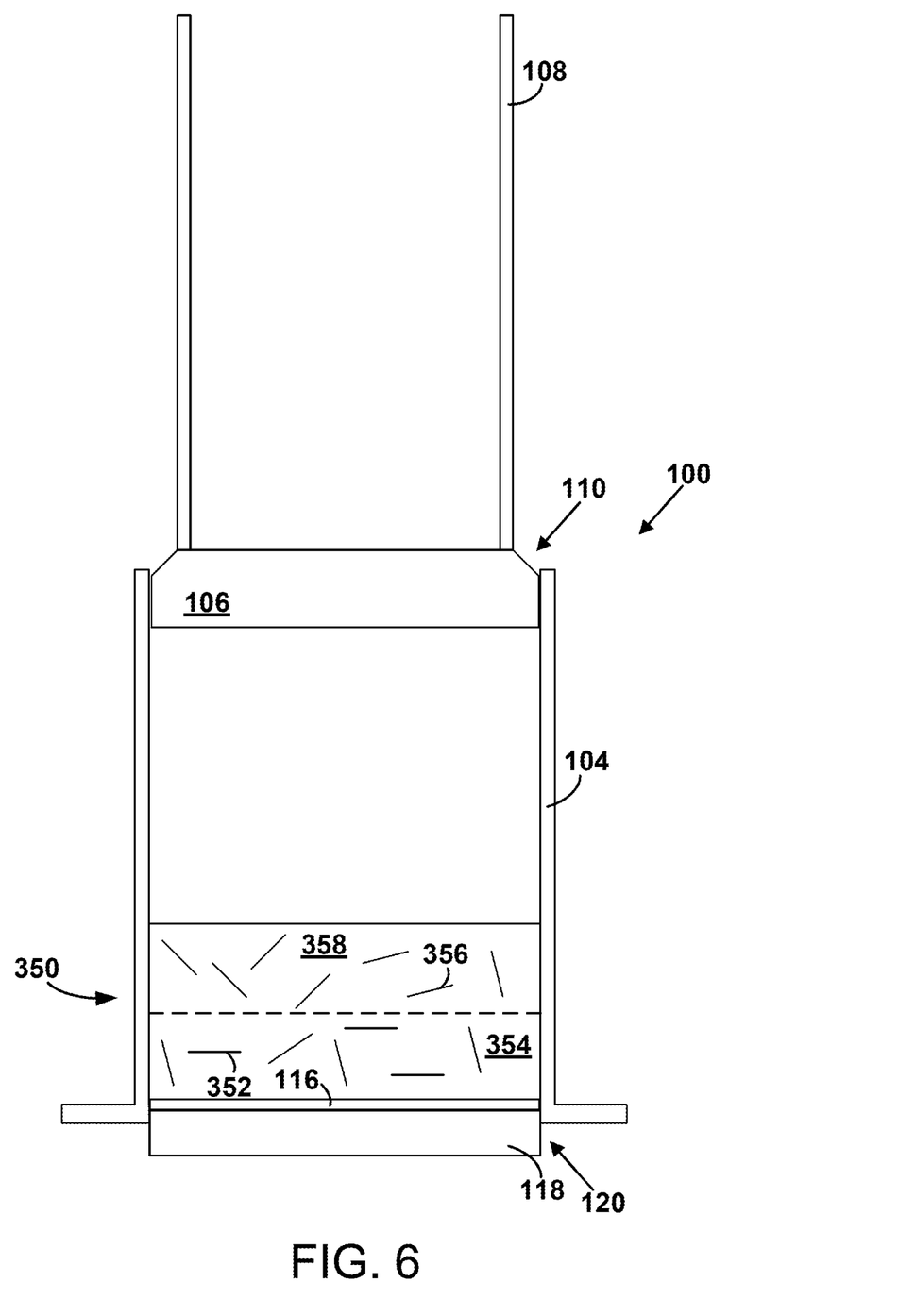
FIG. 6 is a cross sectional view of an apparatus in use, according to an example.

FIG. 6 shows the apparatus 100 after a precursor material 350 has been prepared and placed into the syringe 104. The precursor material 350 can be prepared by mixing ferromagnetic particles into the matrix material (e.g., in a bowl). The precursor material 350 includes first ferromagnetic particles 352 that are embedded within a first portion 354 of a matrix material and second ferromagnetic particles 356 embedded within a second portion 358 of the matrix material. The first ferromagnetic particles 352 and the second ferromagnetic particles 356 are generally the same as or similar to the ferromagnetic particles 204 shown in FIG. 3. The first portion 354 of the matrix material and the second portion 358 of the matrix material are generally the same as or similar to the matrix material 202 shown in FIG. 3. That is, the first ferromagnetic particles 352 are typically indistinguishable from the second ferromagnetic particles 356 and the first portion 354 of the matrix material is typically indistinguishable from the second portion 358 of the matrix material.

In some examples, the first ferromagnetic particles 352 and the second ferromagnetic particles 356 are 5 to 25 percent of the precursor material 350 measured by mass.

In some examples, the first ferromagnetic particles 352 and the second ferromagnetic particles 356 are 0.1 to 2 percent (e.g., 0.5 to 1 percent) of the precursor material 350 measured by volume.

As shown in FIG. 6, the precursor material 350 can be placed into the syringe 104 between the piston 106 and the second end 120 of the syringe, and the filter 116 (e.g., the hub 118) can be attached to the second end 120 of the syringe 104. If the apparatus 100 is oriented as shown in FIG. 6, the filter 116 and the hub 118 will generally be attached to the second end 120 of the syringe 104 before the precursor material 350 is inserted into the syringe 104 and the piston 106 will generally be inserted into the syringe 104 after the precursor material 350 is inserted into the syringe 104. Alternatively, if the syringe 104 is positioned as shown in FIG. 7, the filter 116 and the hub 118 will generally be attached to the second end 120 after the precursor material 350 is inserted into the syringe 104 and the piston 106 will be inserted into the syringe 104 before the precursor material 350 is inserted into the syringe 104.

Figure 7:
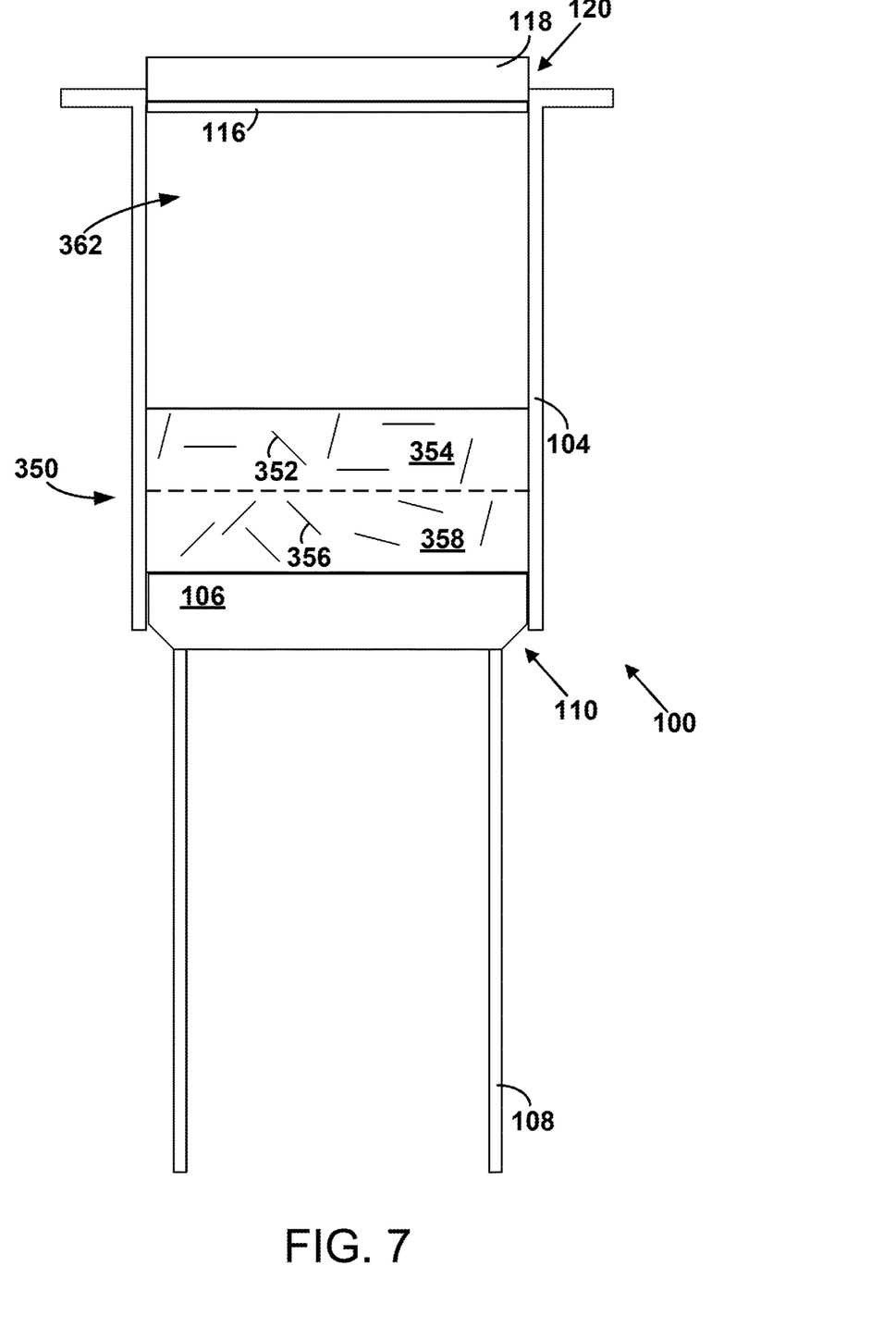
FIG. 7 is a cross sectional view of an apparatus in use, according to an example.

FIG. 7 also shows the apparatus 100 after the precursor material 350 has been placed into the syringe 104. In some embodiments, the syringe 104 can be operated to remove air 362 from the syringe 104 by pushing the piston 106 (e.g., pushing the hollow piston shaft 108) upward toward the second end 120 of the syringe 104. Generally, removal of the air 362 is performed prior to forcing the first portion 354 of the matrix material through the filter 116. Removal of the air 362 is usually performed with the second end 120 of the syringe 104 pointing up so that the air 362 can be removed without yet forcing any of the matrix material through the filter 116.

Figure 8:
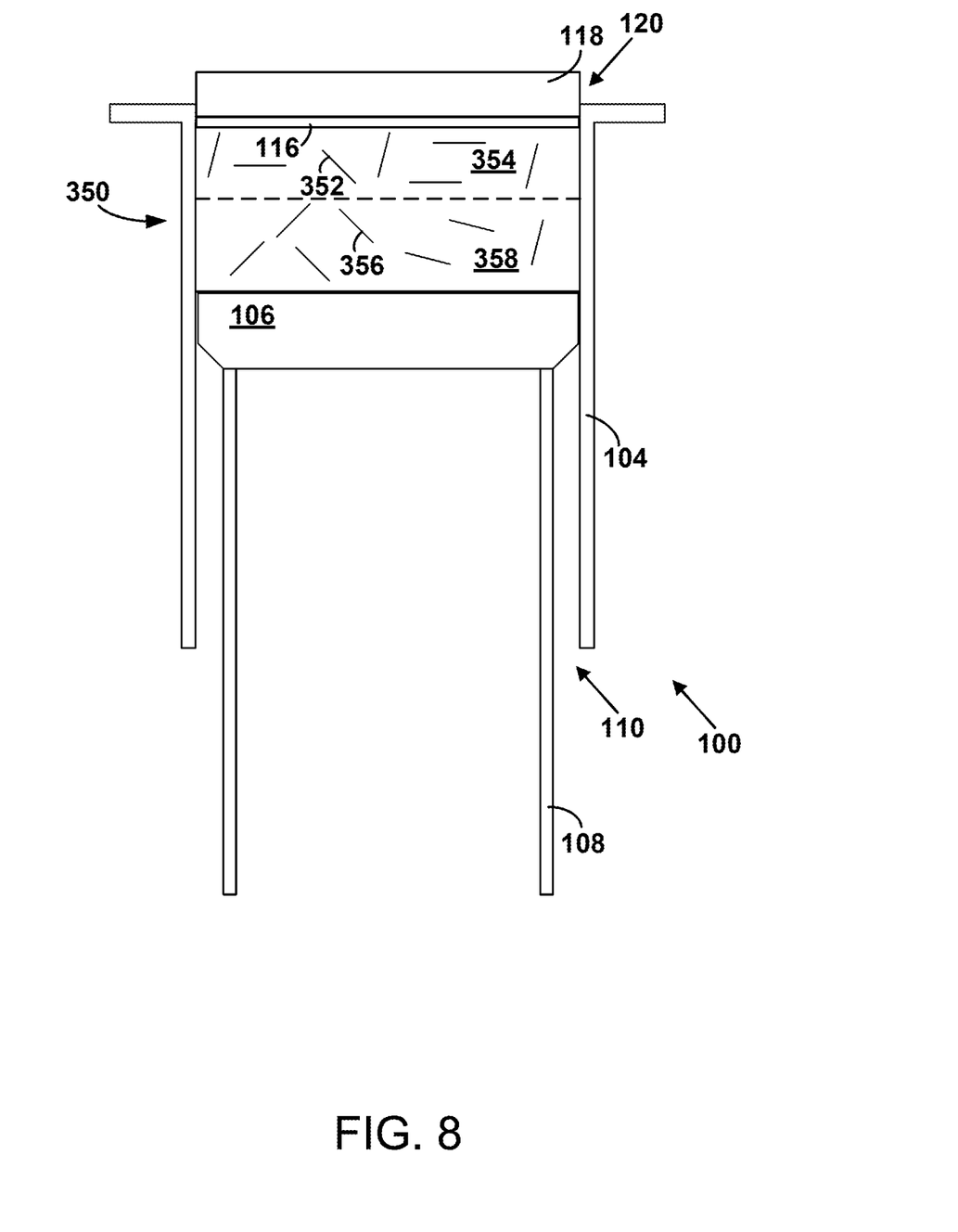
FIG. 8 is a cross sectional view of an apparatus in use, according to an example.

FIG. 8 shows the apparatus 100 after the air 362 has been removed from the syringe 104.

Figure 9:
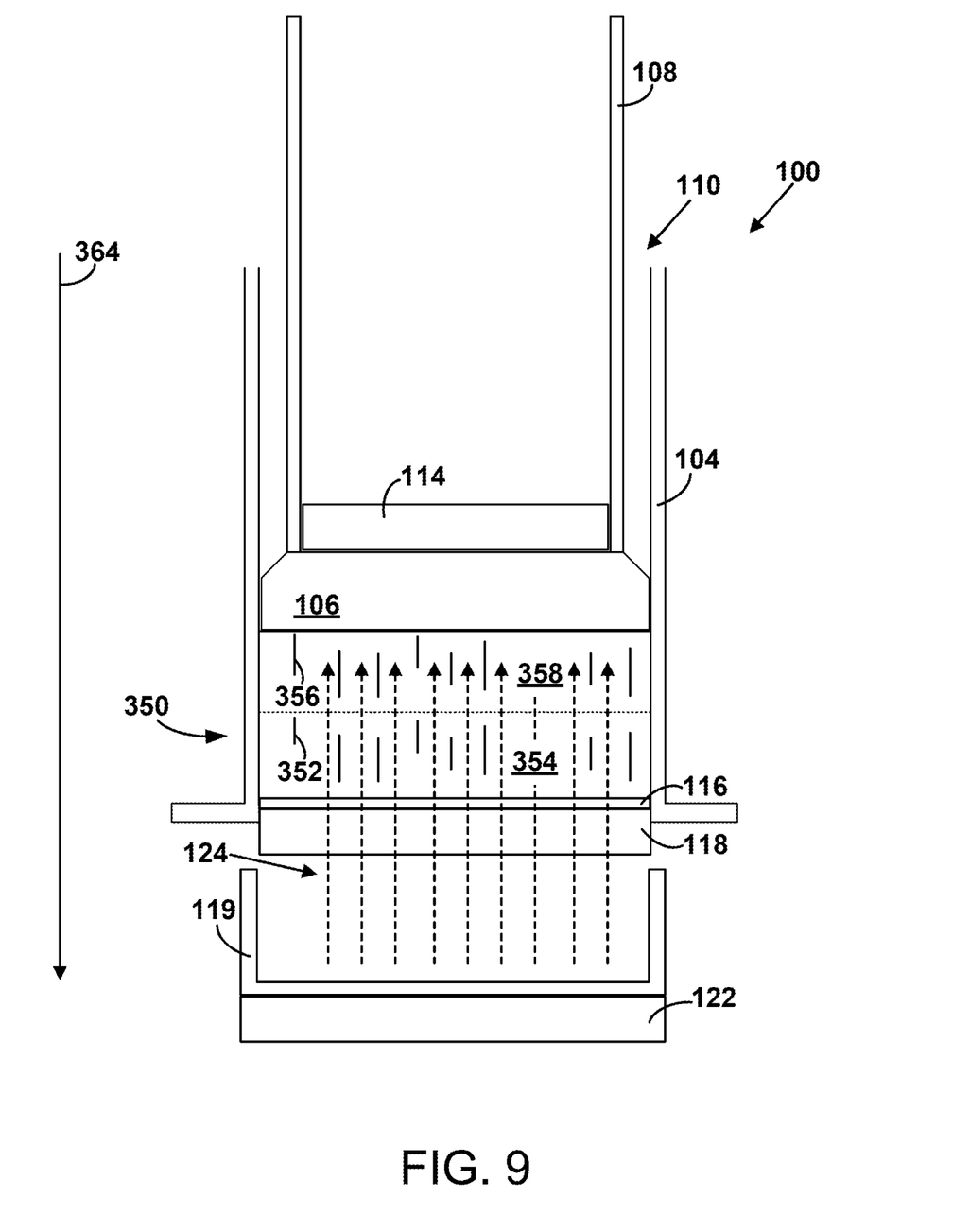
FIG. 9 is a cross sectional view of an apparatus in use, according to an example.

In FIG. 9, the first magnet 114 and the second magnet 122 have been placed in respective positions so that the first magnet 114 and the second magnet 122 are configured to apply the magnetic field 124 to the precursor material 350. The first magnet 114 is typically placed on top of the piston 106 within the hollow piston shaft 108. That is, the piston 106 is generally between the precursor material 350 and the first magnet 114. The second magnet 122 is typically placed under the drip cup 119 or otherwise under the hub 118 and/or under the filter 116. The strength of the magnetic field 124 will generally increase as the first magnet 114 and the second magnet 122 are moved closer together.

The magnetic field 124 causes the first ferromagnetic particles 352 and the second ferromagnetic particles 356 to move such that longitudinal axes of the first ferromagnetic particles 352 and the second ferromagnetic particles 356 become more aligned with the magnetic field 124 as shown in FIG. 9. Additionally, the syringe 104 can be positioned so that a gravitational force 364 acts to move the precursor material 350 toward the filter 116.

Figure 10:
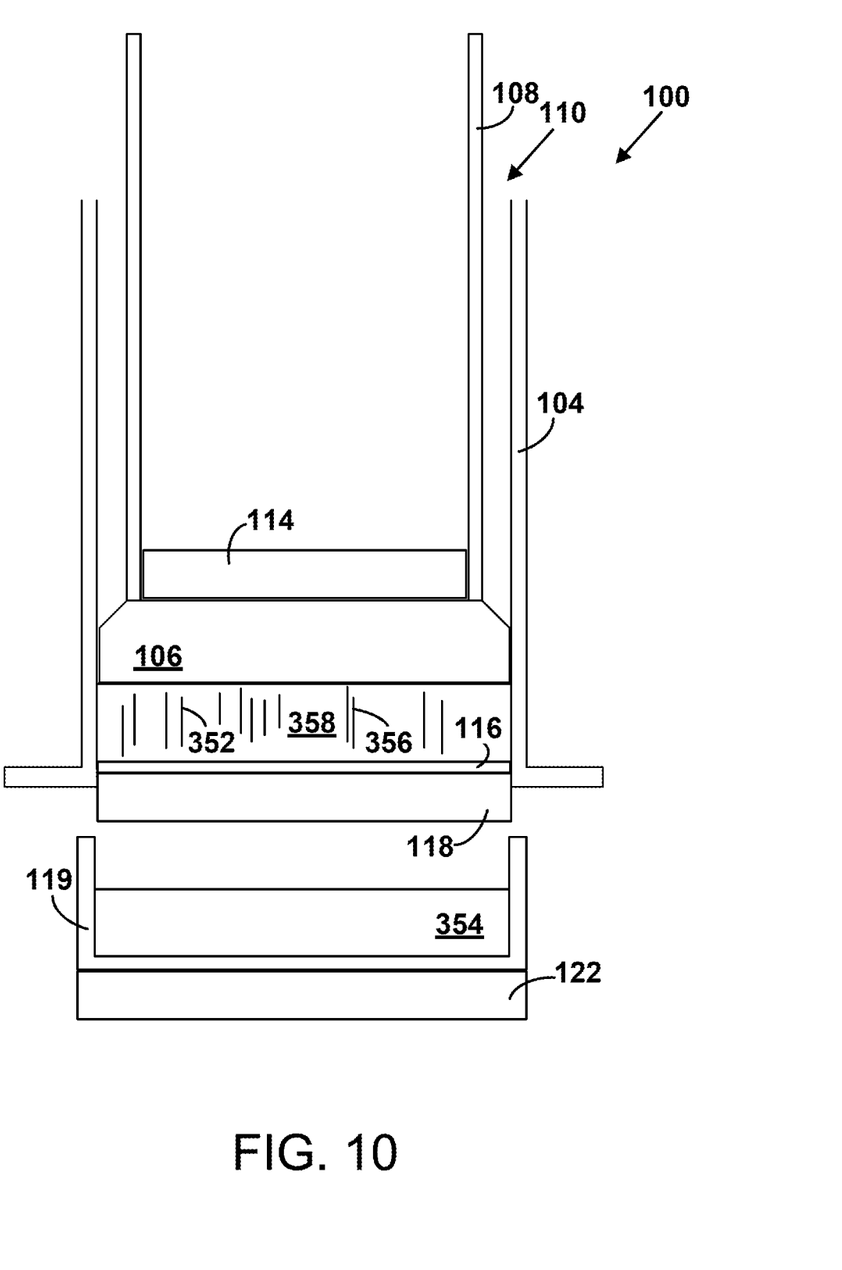
FIG. 10 is a cross sectional view of an apparatus in use, according to an example.

FIG. 10 shows the apparatus 100 after the apparatus 100 has been operated to force the first portion 354 of the matrix material through the filter 116, thereby moving the first ferromagnetic particles 352 from the first portion 354 of the matrix material into the second portion 358 of the matrix material. That is, the operation of the apparatus 100 concentrates the ferromagnetic particles within the second portion 358 of the matrix material.

Figure 11:
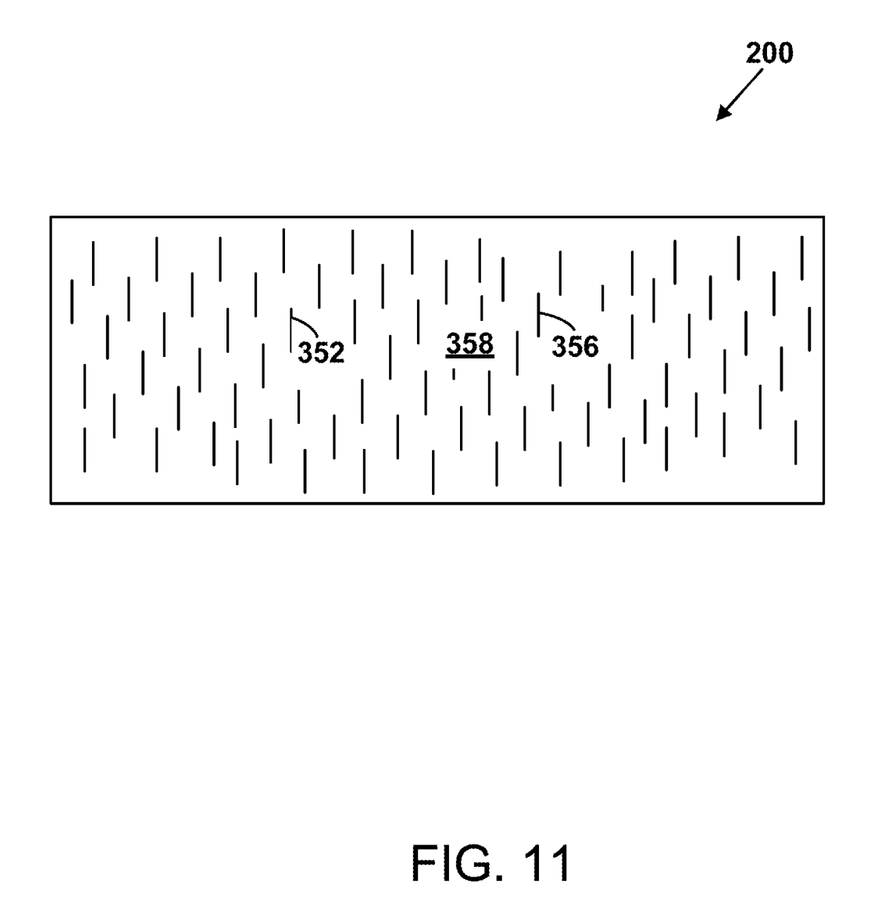
FIG. 11 is a cross sectional view of an electromagnetic shielding material, according to an example.

In FIG. 11, the second portion 358 of the matrix material is shown removed from the syringe and cured (e.g., heated and/or hardened) to form the electromagnetic shielding material 200, which is also shown in FIG. 3. The second portion 358 of the matrix material can be cured in an oven or in ambient room temperature conditions, for example.

The first ferromagnetic particles 352 and the second ferromagnetic particles 356 can make up 20 to 70 percent of the electromagnetic shielding material 200 measured by mass.

The first ferromagnetic particles 352 and the second ferromagnetic particles 356 can make up 5 to 30 percent of the electromagnetic shielding material 200 measured by volume.

FIGS. 12-15 are block diagrams of the respective methods 300, 330, 340, and 345 of forming the electromagnetic shielding material 200, according to example implementations. The methods 300, 330, 340, and 345 present examples of methods that could be used with the apparatus 100 to form the electromagnetic shielding material 200 as shown in FIGS. 1-11. As shown in FIGS. 12-15, the methods 300, 330, 340, and 345 include one or more operations, functions, or actions as illustrated by blocks 302, 304, 306, 308, 310, 312, and 314. Although the blocks are illustrated in a sequential order, these blocks may also be performed in parallel, and/or in a different order than those described herein. Also, the various blocks may be combined into fewer blocks, divided into additional blocks, and/or removed based upon the desired implementation.

Figure 12:
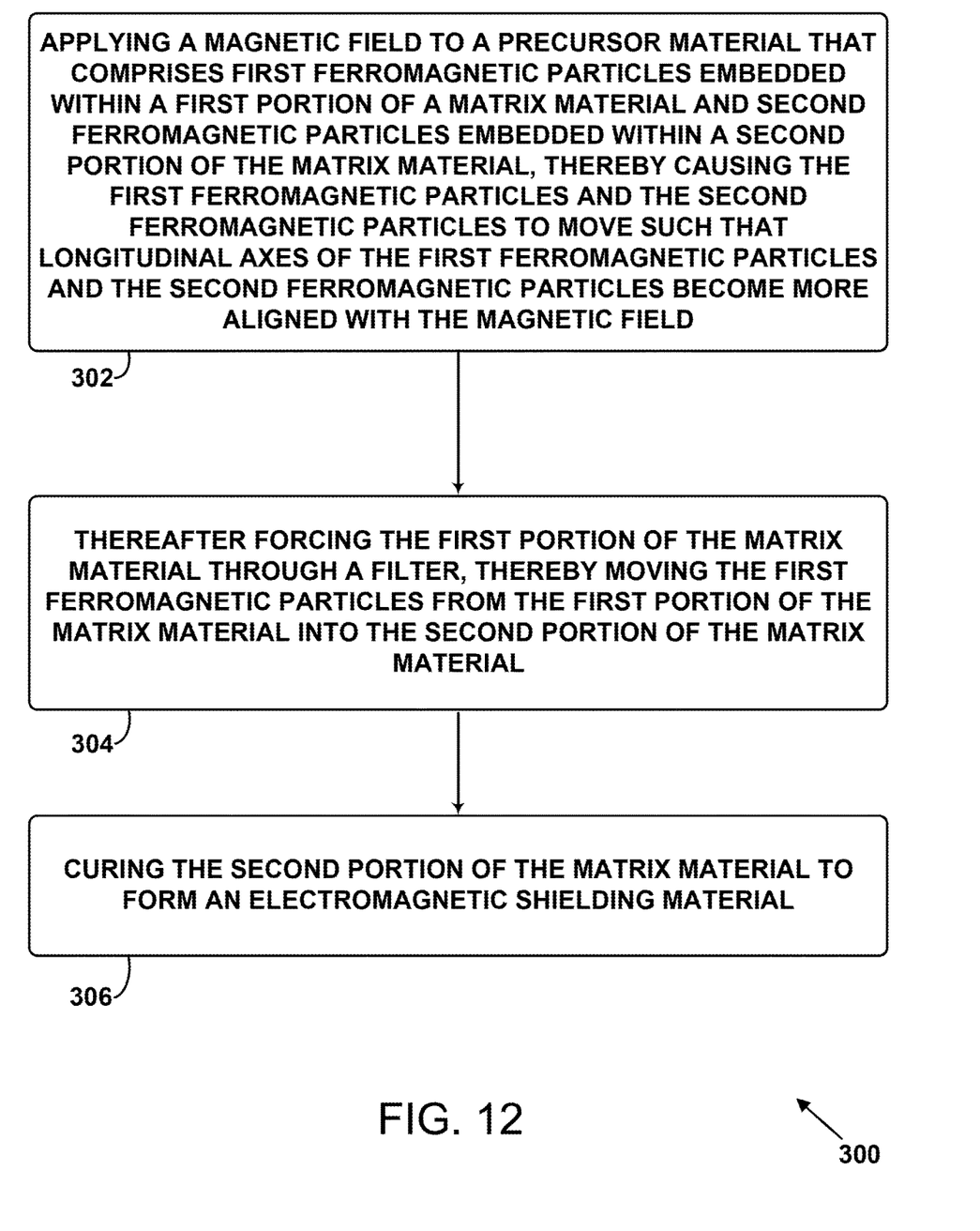
FIG. 12 is a block diagram of a method, according to an example.

FIG. 12 is a block diagram of the method 300.

At block 302, the method 300 includes applying the magnetic field 124 to the precursor material 350 that comprises the first ferromagnetic particles 352 embedded within the first portion 354 of the matrix material 202 and the second ferromagnetic particles 356 embedded within the second portion 358 of the matrix material 202, thereby causing the first ferromagnetic particles 352 and the second ferromagnetic particles 356 to move such that the longitudinal axes 206 of the first ferromagnetic particles 352 and the second ferromagnetic particles 356 become more aligned with the magnetic field 124.

At block 304, the method 300 includes thereafter forcing the first portion 354 of the matrix material 202 through the filter 116, thereby moving the first ferromagnetic particles 352 from the first portion 354 of the matrix material 202 into the second portion 358 of the matrix material 202.

At block 306, the method 300 includes curing the second portion 358 of the matrix material 202 to form the electromagnetic shielding material 200.

Figure 13:
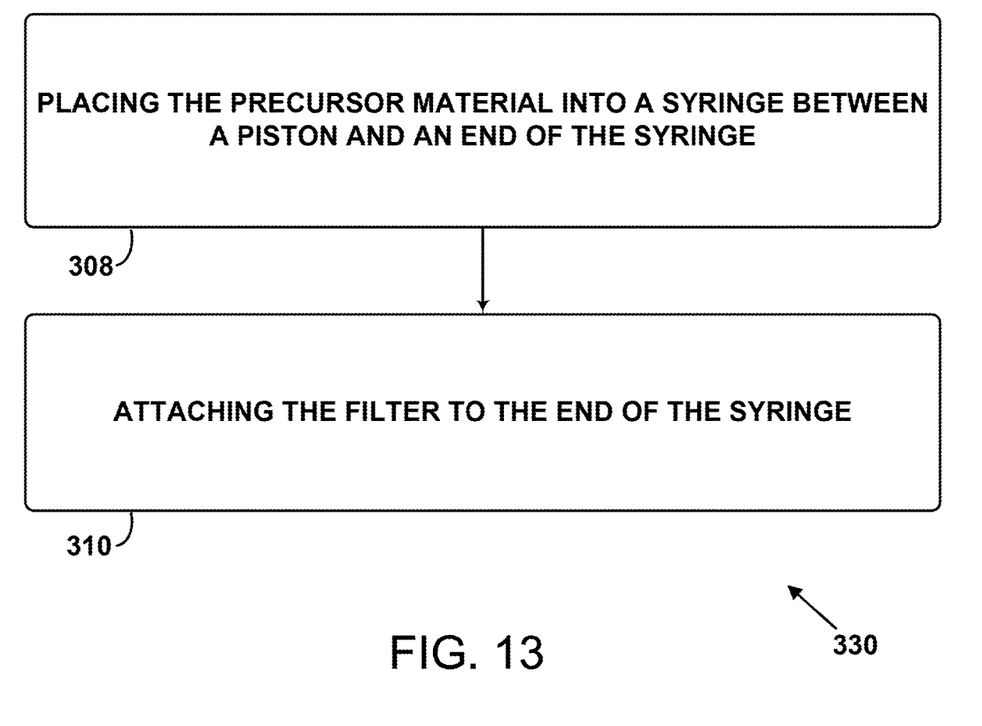
FIG. 13 is a block diagram of a method, according to an example.

FIG. 13 is a block diagram of the method 330.

At block 308, the method 330 includes placing the precursor material 350 into the syringe 104 between the piston 106 and the second end 120 of the syringe 104.

At block 310, the method 330 includes attaching the filter 116 to the second end 120 of the syringe 104. In this context, forcing the first portion 354 of the matrix material 202 through the filter 116 comprises forcing the first portion 354 of the matrix material 202 through the filter 116 by moving the piston 106 toward the filter 116.

Figure 14:
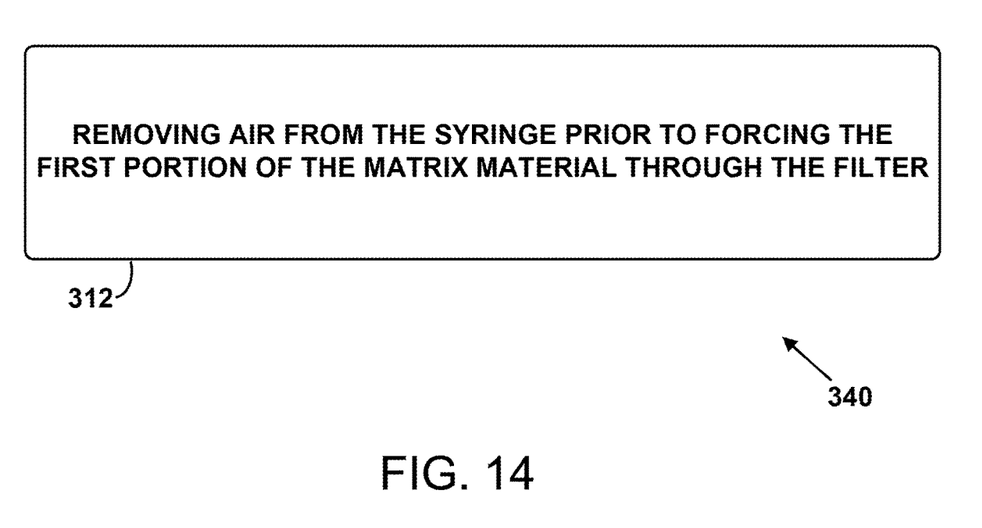
FIG. 14 is a block diagram of a method, according to an example.

FIG. 14 is a block diagram of the method 340.

At block 312, the method 340 includes removing the air 362 from the syringe 104 prior to forcing the first portion 354 of the matrix material 202 through the filter 116.

Figure 15:
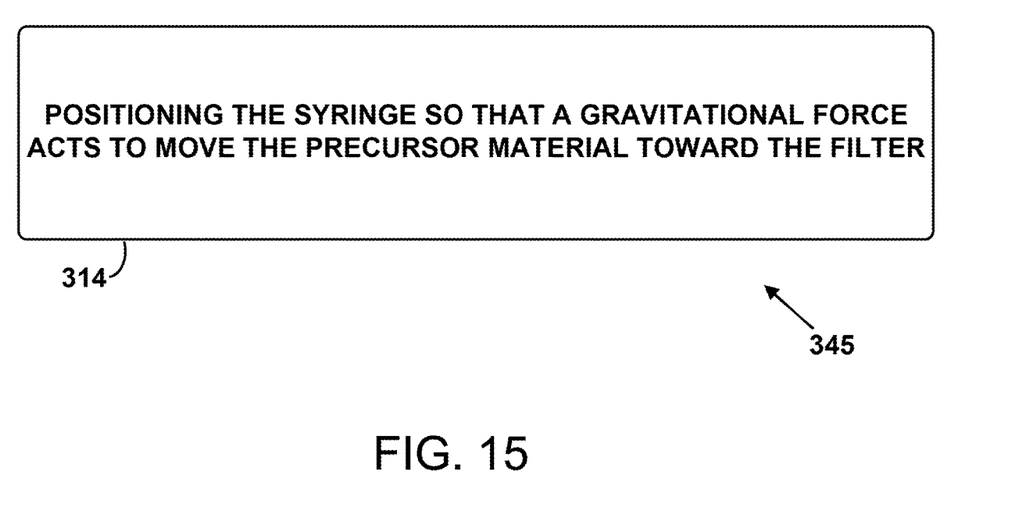
FIG. 15 is a block diagram of a method, according to an example.

FIG. 15 is a block diagram of the method 345.

At block 314, the method 345 includes positioning the syringe 104 so that the gravitational force 364 acts to move the precursor material 350 toward the filter 116.

It should be understood that for this and other processes and methods disclosed herein, flowcharts show functionality and operation of one possible implementation of present examples. Alternative implementations are included within the scope of the examples of the present disclosure in which functions may be executed out of order from that shown or discussed, including substantially concurrent or in reverse order, depending on the functionality involved, as would be understood by those reasonably skilled in the art.

Examples of the present disclosure can thus relate to one of the enumerated clauses (ECs) listed below.

EC 1 is a method of forming an electromagnetic shielding material, the method comprising: applying a magnetic field to a precursor material that comprises first ferromagnetic particles embedded within a first portion of a matrix material and second ferromagnetic particles embedded within a second portion of the matrix material, thereby causing the first ferromagnetic particles and the second ferromagnetic particles to move such that longitudinal axes of the first ferromagnetic particles and the second ferromagnetic particles become more aligned with the magnetic field; thereafter forcing the first portion of the matrix material through a filter, thereby moving the first ferromagnetic particles from the first portion of the matrix material into the second portion of the matrix material; and curing the second portion of the matrix material to form the electromagnetic shielding material.

EC 2 is the method of EC 1, wherein the matrix material comprises a curable viscous resin.

EC 3 is the method of any of ECs 1-2, further comprising: placing the precursor material into a syringe between a piston and an end of the syringe; and attaching the filter to the end of the syringe, wherein forcing the first portion of the matrix material through the filter comprises forcing the first portion of the matrix material through the filter by moving the piston toward the filter.

EC 4 is the method of EC 3, further comprising removing air from the syringe prior to forcing the first portion of the matrix material through the filter.

EC 5 is the method of any of ECs 3-4, further comprising positioning the syringe so that a gravitational force acts to move the precursor material toward the filter.

EC 6 is method of any of ECs 3-5, wherein applying the magnetic field comprises applying the magnetic field with a magnet that is positioned on the piston.

EC 7 is the method of EC 6, wherein the piston is between the magnet and the precursor material.

EC 8 is the method of any of ECs 3-7, wherein applying the magnetic field comprises applying the magnetic field with a magnet, wherein the filter is between the precursor material and the magnet.

EC 9 is the method of any of ECs 1-8, wherein the first ferromagnetic particles and the second ferromagnetic particles are 5 to 25 percent of the precursor material measured by mass.

EC 10 is the method of any of ECs 1-9, wherein the first ferromagnetic particles and the second ferromagnetic particles are 20 to 70 percent of the electromagnetic shielding material measured by mass.

EC 11 is the method of any of ECs 1-10, wherein the first ferromagnetic particles and the second ferromagnetic particles are 0.1 to 2 percent of the precursor material measured by volume.

EC 12 is the method of any of ECs 1-11, wherein the first ferromagnetic particles and the second ferromagnetic particles are 5 to 30 percent of the electromagnetic shielding material measured by volume.

EC 13 is the method of any of ECs 1-12, wherein the filter comprises cellulosic fibers.

EC 14 is the method of any of ECs 1-13, wherein the first ferromagnetic particles and the second ferromagnetic particles comprise one or more of iron, nickel, or cobalt.

EC 15 is the method of EC 14, wherein the first ferromagnetic particles and the second ferromagnetic particles further comprise one or more of molybdenum, manganese, tin, copper, titanium, or aluminum.

EC 16 is the method of any of ECs 1-15, wherein the first ferromagnetic particles and the second ferromagnetic particles are coated in an electrically insulating material that is distinct from the matrix material.

EC 17 is the method of any of ECs 1-16, wherein curing the second portion of the matrix material comprises heating and hardening the second portion of the matrix material.

EC 18 is an electromagnetic shielding material comprising: a matrix material; and ferromagnetic particles embedded within the matrix material and having respective longitudinal axes that are substantially parallel to each other, wherein the ferromagnetic particles are 20 to 70 percent of the electromagnetic shielding material measured by mass.

EC 19 is the electromagnetic shielding material of EC 18, wherein the ferromagnetic particles are 5 to 30 percent of the electromagnetic shielding material measured by volume.

EC 20 is an apparatus for forming an electromagnetic shielding material, the apparatus comprising: a syringe; a piston; a hollow piston shaft attached to the piston, wherein the piston and the hollow piston shaft are configured to be inserted into the syringe at a first end of the syringe such that the piston makes an airtight seal with the syringe; a first magnet positioned within the hollow piston shaft; a filter; a hub configured to house the filter and to be attached to a second end of the syringe; and a second magnet, wherein the first magnet and the second magnet are configured to apply a magnetic field within the syringe.

The description of the different advantageous arrangements has been presented for purposes of illustration and description, and is not intended to be exhaustive or limited to the examples in the form disclosed. Many modifications and variations will be apparent to those of ordinary skill in the art. Further, different advantageous examples may describe different advantages as compared to other advantageous examples. The example or examples selected are chosen and described in order to explain the principles of the examples, the practical application, and to enable others of ordinary skill in the art to understand the disclosure for various examples with various modifications as are suited to the particular use contemplated.

What is claimed is:

1. A method of forming an electromagnetic shielding material, the method comprising:
    applying a magnetic field to a precursor material that comprises first ferromagnetic particles embedded within a first portion of a matrix material and second ferromagnetic particles embedded within a second portion of the matrix material, thereby causing the first ferromagnetic particles and the second ferromagnetic particles to move such that longitudinal axes of the first ferromagnetic particles and the second ferromagnetic particles become more aligned with the magnetic field;
    thereafter forcing the first portion of the matrix material through a filter, thereby moving the first ferromagnetic particles from the first portion of the matrix material into the second portion of the matrix material; and
    curing the second portion of the matrix material to form the electromagnetic shielding material.

2. The method of claim 1, wherein the matrix material comprises a curable viscous resin.

3. The method of claim 2, wherein the curable viscous resin comprises an epoxy resin.

4. The method of claim 1, further comprising:
    placing the precursor material into a syringe between a piston and an end of the syringe; and
    attaching the filter to the end of the syringe,
    wherein forcing the first portion of the matrix material through the filter comprises forcing the first portion of the matrix material through the filter by moving the piston toward the filter.

5. The method of claim 4, further comprising removing air from the syringe prior to forcing the first portion of the matrix material through the filter.

6. The method of claim 4, further comprising positioning the syringe so that a gravitational force acts to move the precursor material toward the filter.

7. The method of claim 4, wherein applying the magnetic field comprises applying the magnetic field with a magnet that is positioned on the piston.

8. The method of claim 7, wherein the piston is between the magnet and the precursor material.

9. The method of claim 7, wherein the magnet comprises neodymium.

10. The method of claim 4, wherein applying the magnetic field comprises applying the magnetic field with a magnet, wherein the filter is between the precursor material and the magnet.

11. The method of claim 10, wherein the magnet comprises neodymium.

12. The method of claim 1, wherein the first ferromagnetic particles and the second ferromagnetic particles are 5 to 25 percent of the precursor material measured by mass.

13. The method of claim 1, wherein the first ferromagnetic particles and the second ferromagnetic particles are 20 to 70 percent of the electromagnetic shielding material measured by mass.

14. The method of claim 1, wherein the first ferromagnetic particles and the second ferromagnetic particles are 0.1 to 2 percent of the precursor material measured by volume.

15. The method of claim 1, wherein the first ferromagnetic particles and the second ferromagnetic particles are 5 to 30 percent of the electromagnetic shielding material measured by volume.

16. The method of claim 1, wherein the filter comprises cellulosic fibers.

17. The method of claim 1, wherein the first ferromagnetic particles and the second ferromagnetic particles comprise one or more of iron, nickel, or cobalt.

18. The method of claim 17, wherein the first ferromagnetic particles and the second ferromagnetic particles further comprise one or more of molybdenum, manganese, tin, copper, titanium, or aluminum.

19. The method of claim 1, wherein the first ferromagnetic particles and the second ferromagnetic particles are coated in an electrically insulating material that is distinct from the matrix material.

20. The method of claim 1, wherein curing the second portion of the matrix material comprises heating and hardening the second portion of the matrix material.

* * * * *